US012666720B2

(12) United States Patent
Shin et al.

(10) Patent No.: US 12,666,720 B2
(45) Date of Patent: Jun. 23, 2026

(54) DISPLAY DEVICE AND METHOD OF MANUFACTURING THE SAME

(71) Applicant: Samsung Display Co., LTD., Yongin-si (KR)

(72) Inventors: Hyuneok Shin, Yongin-si (KR); Dokeun Song, Yongin-si (KR); Sukyoung Yang, Yongin-si (KR); Dongmin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 329 days.

(21) Appl. No.: 18/220,132

(22) Filed: Jul. 10, 2023

(65) Prior Publication Data

US 2024/0136361 A1    Apr. 25, 2024
US 2024/0234429 A9    Jul. 11, 2024

(30) Foreign Application Priority Data

Oct. 25, 2022    (KR) ........................ 10-2022-0138425

(51) Int. Cl.
| | |
|---|---|
| *H01L 27/12* | (2006.01) |
| *H10D 86/01* | (2025.01) |
| *H10D 86/40* | (2025.01) |
| *H10D 86/60* | (2025.01) |

(52) U.S. Cl.
CPC ......... *H10D 86/60* (2025.01); *H10D 86/0221* (2025.01); *H10D 86/423* (2025.01)

(58) Field of Classification Search
CPC .... H10D 86/60; H10D 86/0221; H10D 86/01; H10D 86/423; H10D 86/40; H10D 86/441; H10D 86/021; H10D 86/421; H10D 30/67; H10D 30/6739; H10D 30/0321; H10D 30/01; H10D 30/6745; H10D 64/01; H10D 64/666; H10D 64/66; G09F 9/335; G09F 9/33; G09F 9/32; G09F 9/20; G09F 9/34; H10K 59/1213; H10K 59/121; H10K 71/00; H10K 71/40; H10K 71/15; H10K 71/10; H10K 59/12; H10K 59/1201
See application file for complete search history.

(56) References Cited

U.S. PATENT DOCUMENTS

| | | | | |
|---|---|---|---|---|
| 11,158,693 B2 * | 10/2021 | Chung | .................... | H10D 86/60 |
| 11,721,724 B2 * | 8/2023 | Thomas | ................ | H10D 64/27 257/9 |
| 12,080,721 B2 * | 9/2024 | Shin | ..................... | H10K 59/131 |
| 12,089,444 B2 * | 9/2024 | Okabe | ................... | H05B 33/10 |

(Continued)

FOREIGN PATENT DOCUMENTS

| | | |
|---|---|---|
| CN | 104952884 A | 9/2015 |
| KR | 10-2006-0131071 A | 12/2006 |

(Continued)

*Primary Examiner* — Nikolay K Yushin
(74) *Attorney, Agent, or Firm* — Womble Bond Dickinson (US) LLP

(57) ABSTRACT

A display device includes: a substrate; an active layer on the substrate; and a gate electrode on the active layer. The gate electrode includes a first metal layer, a second metal layer on the first metal layer, and a third metal layer on the second metal layer. The first metal layer includes aluminum, the second metal layer includes transparent conductive oxide, and the third metal layer includes a niobium-titanium alloy.

20 Claims, 15 Drawing Sheets

(56)           References Cited

U.S. PATENT DOCUMENTS

| | | | |
|---|---|---|---|
| 12,328,940 B2 * | 6/2025 | More | H10D 84/853 |
| 2011/0284836 A1 | 11/2011 | Lee et al. | |
| 2020/0111854 A1 * | 4/2020 | Chung | H10D 86/481 |
| 2021/0296364 A1 * | 9/2021 | Shin | H10D 86/021 |
| 2021/0328019 A1 * | 10/2021 | Thomas | H10D 64/01 |
| 2022/0344423 A1 * | 10/2022 | Okabe | H10K 59/1213 |
| 2022/0352160 A1 * | 11/2022 | More | H10D 84/85 |
| 2023/0047134 A1 * | 2/2023 | Lee | H10K 71/00 |

FOREIGN PATENT DOCUMENTS

| | | |
|---|---|---|
| KR | 10-2011-0128038 A | 11/2011 |
| KR | 10-2015-0034947 A | 4/2015 |
| KR | 10-2020-0042971 A | 4/2020 |

* cited by examiner

DISPLAY DEVICE AND METHOD OF MANUFACTURING THE SAME

CROSS-REFERENCE TO RELATED APPLICATION(S)

This application claims priority to and the benefit of Korean Patent Application No. 10-2022-0138425, filed in the Korean Intellectual Property Office (KIPO) on Oct. 25, 2022, the entire disclosure of which is incorporated herein by reference.

BACKGROUND

1. Field

Aspects of embodiments of the present disclosure relate to a display device and a method of manufacturing the same.

2. Description of the Related Art

A display device is a device that provides visual information to a user by displaying an image. From among the various types of display devices, an organic light emitting display device has recently been attracting attention.

The organic light emitting display device has self-luminous properties and, accordingly, does not require a separate light source unlike a liquid crystal display device. Accordingly, thickness and weight of the organic light emitting display device may be reduced. In addition, the organic light emitting display device exhibits desirable characteristics, such as low power consumption, high luminance, and high response speed.

SUMMARY

Embodiments of the present disclosure provide a display device with improved display quality.

Embodiments of the present disclosure provide a method of manufacturing the display device.

A display device, according to an embodiment of the present disclosure, includes a substrate, an active layer on the substrate, and a gate electrode on the active layer. The gate electrode includes a first metal layer, a second metal layer on the first metal layer, and a third metal layer on the second metal layer. The first metal layer includes aluminum, the second metal layer includes a transparent conductive oxide, and the third metal layer includes a niobium (Nb)-titanium (Ti) alloy.

In an embodiment, a content of titanium in the niobium-titanium alloy may be about 50 at % or less.

In an embodiment, the first metal layer may include an aluminum alloy.

In an embodiment, a content of materials other than aluminum in the aluminum alloy may be about 0.1 at % or less.

In an embodiment, the second metal layer may include indium gallium zinc oxide (IGZO).

In an embodiment, the second metal layer may include indium zinc oxide (IZO).

In an embodiment, the first metal layer may have a thickness in a range of about 2500 Å to about 3500 Å.

In an embodiment, each of the second metal layer and the third metal layer may have a thickness in a range of about 200 Å to about 300 Å.

In an embodiment, the active layer may include polycrystalline silicon.

A display device, according to an embodiment of the present disclosure, includes a substrate, an active layer on the substrate and including polycrystalline silicon, and a gate electrode on the active layer and including a first metal layer, a second metal layer on the first metal layer, and a third metal layer on the second metal layer. The first metal layer includes aluminum, the second metal layer includes a niobium (Nb)-titanium (Ti) alloy, and the third metal layer includes a transparent conductive oxide.

In an embodiment, a content of titanium in the niobium-titanium alloy may be about 50 at % or less.

In an embodiment, the first metal layer may include an aluminum alloy.

In an embodiment, a content of materials other than aluminum in the aluminum alloy may be about 0.1 at % or less.

In an embodiment, the third metal layer may include indium gallium zinc oxide (IGZO).

In an embodiment, the third metal layer may include indium zinc oxide (IZO).

In an embodiment, the first metal layer may have a thickness in a range of about 2500 Å to about 3500 Å, and each of the second metal layer and the third metal layer may have a thickness in a range of about 200 Å to about 300 Å.

A method of manufacturing a display device, according to an embodiment of the present disclosure, includes forming an active layer on a substrate, forming a preliminary first metal layer including aluminum on the active layer, forming a preliminary second metal layer including a transparent conductive oxide on the preliminary first metal layer, forming a preliminary third metal layer including a niobium-titanium alloy on the preliminary second metal layer, and forming a gate electrode by patterning the preliminary first metal layer, the preliminary second metal layer, and the preliminary third metal layer.

In an embodiment, the method may further include forming an insulating layer on the gate electrode, forming contact holes in the insulating layer to respectively expose at least a portion of the active layer and the gate electrode, and concurrently cleaning the portion of the active layer and the gate electrode exposed by the contact holes.

In an embodiment, the forming the gate electrode may include forming a third metal layer by dry etching the preliminary third metal layer, forming a second metal layer overlapping the third metal layer by wet etching the preliminary second metal layer, and forming a first metal layer overlapping the second metal layer by dry etching the preliminary first metal layer.

In an embodiment, a content of titanium in the niobium-titanium alloy may be about 50 at % or less.

A display device, according to embodiments of the present disclosure, may include a gate electrode including a first metal layer, a second metal layer on the first metal layer, and a third metal layer on the second metal layer. Because the first metal layer includes aluminum, resistance of electrodes and wires including the first metal layer may be reduced. In addition, because the second metal layer includes a transparent conductive oxide, heat generation of the gate electrode may be controlled. In addition, when a contact hole exposing the gate electrode is formed, the first metal layer may not be etched. Accordingly, connection failure due to an etched first metal layer may be prevented, and display quality of the display device may be improved. In addition, because the third metal layer includes a niobium-titanium alloy, aluminum included in the first metal layer may not be corroded by a reaction between a cleaning solution and the first metal layer during a cleaning process. Accordingly, because a separate mask for the cleaning process may be omitted, efficiency of the manufacturing process of the display device may be improved.

DETAILED DESCRIPTION

Figure 1:
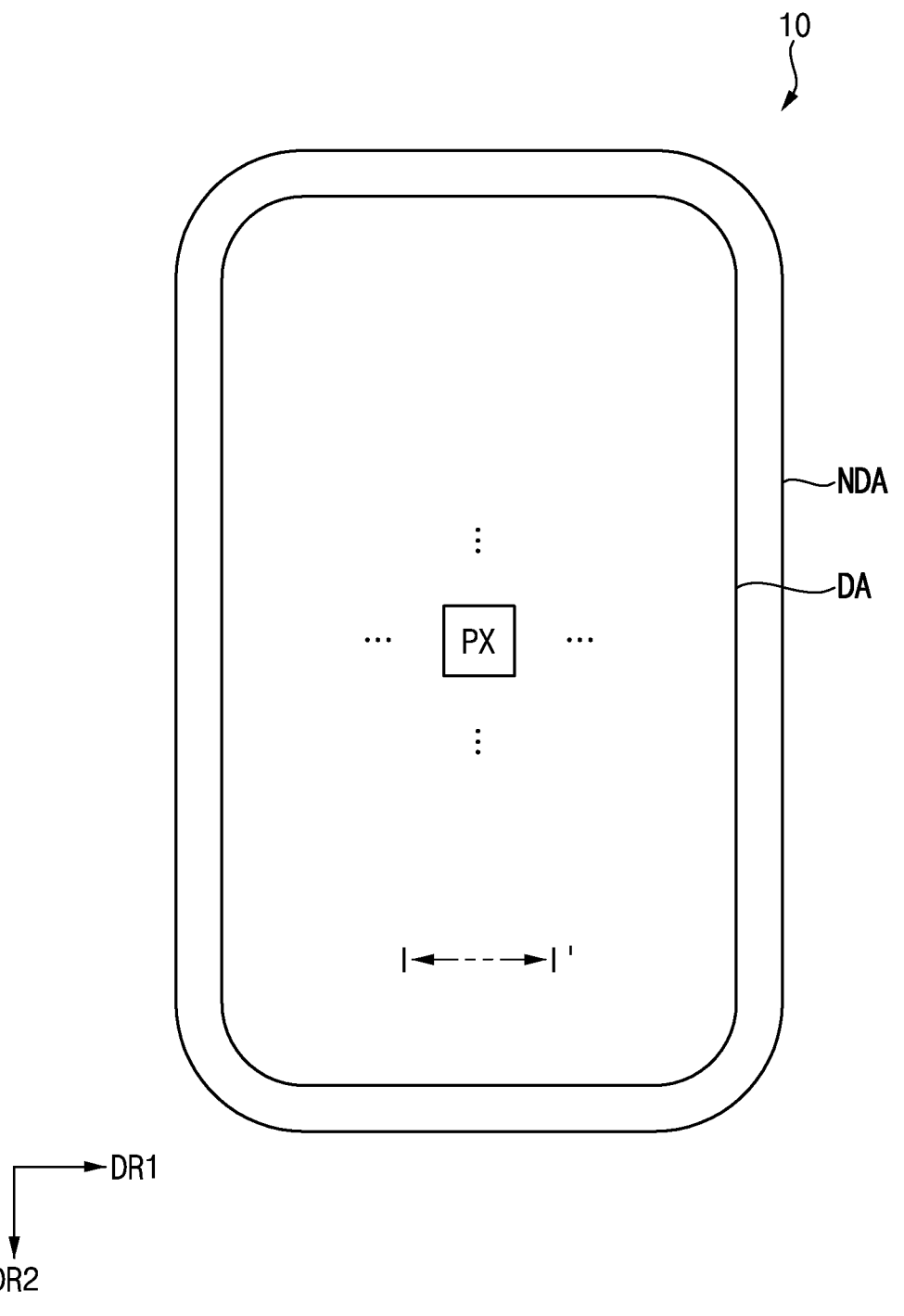
FIG. 1 is a plan view of a display device according to an embodiment of the present disclosure.

Hereinafter, embodiments of the present disclosure will be described in more detail with reference to the accompanying drawings.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

FIG. 1 is a plan view of a display device according to an embodiment of the present disclosure.

Referring to FIG. 1, a display device 10 may have a display area DA and a non-display area NDA.

The display area DA may be an area at where an image is displayed by generating light. A plurality of pixels PX that emits light may be disposed in the display area DA, and accordingly, an image may be displayed in the display area DA. The pixels PX may be arranged in a matrix form (or matrix arrangement) along a first direction DR1 and a second direction DR2 crossing the first direction DR1. For example, the second direction DR2 may be perpendicular to the first direction DR1.

Signal lines, such as a gate line and a data line, may be disposed in the display area DA. Each of the pixels PX may be connected to ones of the signal lines, such as the gate line and the data line. Each of the pixels PX may receive a gate signal, a data signal, and the like from the signal lines.

A planar shape of the display area DA may be a rectangular shape or, as shown in FIG. 1, a rectangular shape with rounded corners. However, the planar shape of the display area DA is not limited thereto, and the display area DA may have various planar shapes, such as a circular shape, an elliptical shape, a polygonal shape, and the like.

The non-display area NDA may be an area at where an image is not displayed. The non-display area NDA may be disposed around (e.g., may extend around) the display area DA and may surround (e.g., may surround in a plan view) at least a portion of the display area DA. For example, the non-display area NDA may entirely surround (or may extend around an entire periphery of) the display area DA. Drivers for displaying an image in the display area DA may be disposed in the non-display area NDA.

Figure 2:
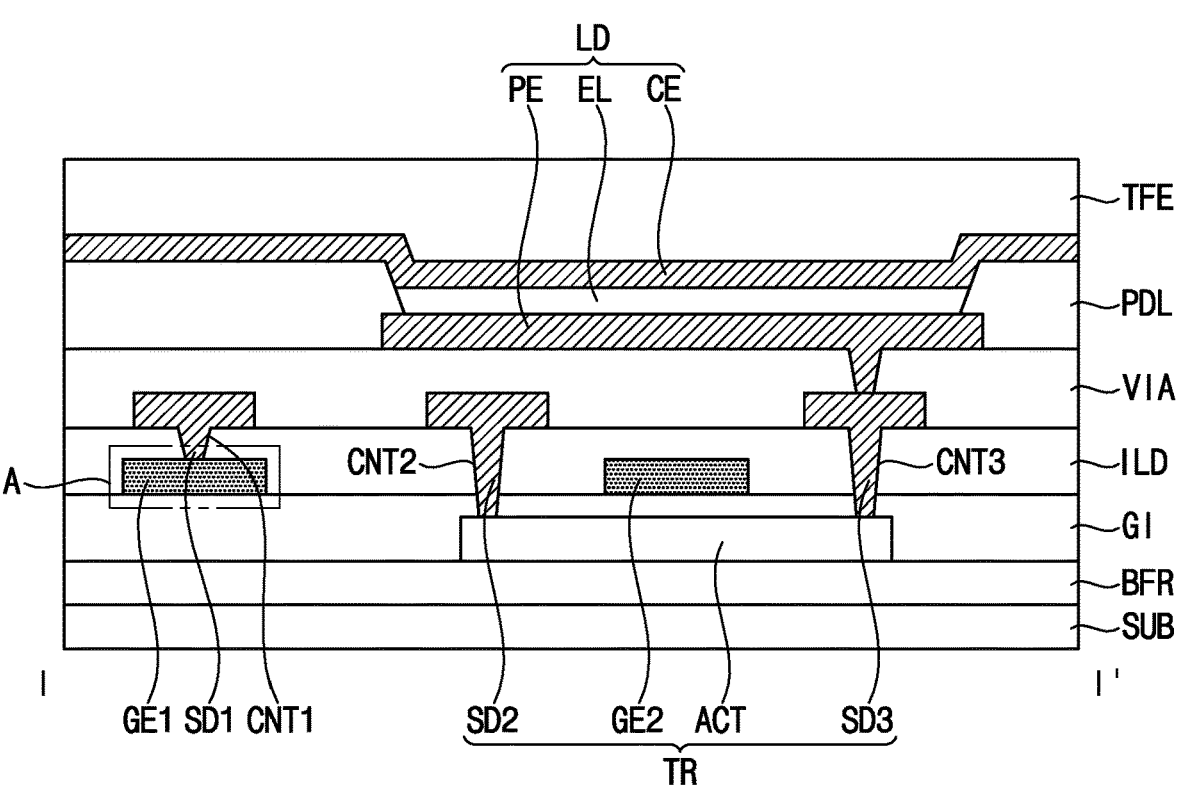
FIG. 2 is a cross-sectional view taken along the line I-I' of FIG. 1.

FIG. 2 is a cross-sectional view taken along the line I-I' of FIG. 1.

Referring to FIG. 2, the display device 10 may include a substrate SUB, a buffer layer BFR, an active layer ACT, a gate insulating layer GI, a first gate electrode GE1, a second gate electrode GE2, an interlayer insulating layer ILD, a first electrode SD1, a second electrode SD2, a third electrode SD3, a via insulating layer VIA, a pixel electrode PE, a pixel defining layer PDL, a light emitting layer EL, a common electrode CE and an encapsulation layer TFE.

The substrate SUB may include a transparent material or an opaque material. Examples of materials that may be used as the substrate SUB may include glass, plastic, and the like.

The buffer layer BFR may be disposed on the substrate SUB. In one embodiment, the buffer layer BFR may include an inorganic insulating material. Examples of inorganic insulating materials that may be used as the buffer layer BFR may include silicon oxide ($SiO_x$), silicon nitride ($SiN_x$), silicon oxynitride ($SiO_xN_y$), and the like. These materials may be used alone or in combination with each other. The buffer layer BFR may prevent metal atoms or impurities from penetrating into the active layer ACT. In addition, the buffer layer BFR may control a heat supply rate during a crystallization process for forming the active layer ACT.

The active layer ACT may be disposed on the buffer layer BFR. In one embodiment, the active layer ACT may include a silicon semiconductor material. Examples of silicon semiconductor materials that may be used as the active layer ACT may include amorphous silicon, polycrystalline silicon, and the like. These materials may be used alone or in combination with each other. The active layer ACT may have a source area, a drain area, and a channel area positioned between the source area and the drain area.

The gate insulating layer GI may be disposed on the buffer layer BFR and may cover the active layer ACT. In one embodiment, the gate insulating layer GI may include an inorganic insulating material. Examples of inorganic insulating materials that may be used as the gate insulating layer GI may include silicon oxide, silicon nitride, silicon oxynitride, and the like. These materials may be used alone or in combination with each other.

A gate layer including the first gate electrode GE1 and the second gate electrode GE2 may be disposed on the gate insulating layer GI. The first gate electrode GE1 and the second gate electrode GE2 may be spaced apart from each other, and the second gate electrode GE2 may overlap the channel area of the active layer ACT. In one embodiment, each of the first gate electrode GE1 and the second gate electrode GE2 may include a conductive material. Examples of conductive materials that may be used as each of the first gate electrode GE1 and the second gate electrode GE2 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and the like. These materials may be used alone or in combination with each other.

The first gate electrode GE1 and the second gate electrode GE2 may include the same material and may be disposed on the same layer. For example, the first gate electrode GE1 and the second gate electrode GE2 may be formed using the same material and during (or through) the same process. In one embodiment, each of the first gate electrode GE1 and the second gate electrode GE2 may be part of the gate line.

The interlayer insulating layer ILD may be disposed on the gate insulating layer GI and may cover the first gate electrode GE1 and the second gate electrode GE2. In one embodiment, the interlayer insulating layer ILD may include an inorganic insulating material. Examples of inorganic insulating materials that may be used as the interlayer insulating layer ILD may include silicon oxide, silicon nitride, silicon oxynitride, and the like. These materials may be used alone or in combination with each other.

The first electrode SD1, the second electrode SD2, and the third electrode SD3 may be disposed on the interlayer insulating layer ILD. In one embodiment, each of the first electrode SD1, the second electrode SD2, and the third electrode SD3 may include a conductive material. Examples of conductive materials that may be used as each of the first electrode SD1, the second electrode SD2, and the third electrode SD3 may include aluminum, platinum, palladium, silver, magnesium, gold, nickel, neodymium, iridium, chromium, lithium, calcium, molybdenum, titanium, tungsten, copper, and the like. These materials may be used alone or in combination with each other.

The first electrode SD1 may contact the first gate electrode GE1 through a first contact hole (e.g., a first contact opening) CNT1 formed by removing a portion of the interlayer insulating layer ILD. The second electrode SD2 may contact the source area of the active layer ACT through a second contact hole (e.g., a second contact opening) CNT2 formed by removing portions of the gate insulating layer GI and the interlayer insulating layer ILD. The third electrode SD3 may contact the drain area of the active layer ACT through a third contact hole (e.g., a third contact opening) CNT3 formed by removing portions of the gate insulating layer GI and the interlayer insulating layer ILD.

The active layer ACT, the second gate electrode GE2, the second electrode SD2, and the third electrode SD3 may form a transistor TR.

The via insulating layer VIA may be disposed on the interlayer insulating layer ILD and may cover the first electrode SD1, the second electrode SD2, and the third electrode SD3. In one embodiment, the via insulating layer VIA may include an organic insulating material. Examples of organic insulating materials that may be used as the via insulating layer VIA may include photoresist, polyacrylic resin, polyimide resin, acrylic resin, and the like. These materials may be used alone or in combination with each other.

The pixel electrode PE may be disposed on the via insulating layer VIA. In one embodiment, the pixel electrode PE may contact the third electrode SD3 through a contact hole (e.g., a contact opening) formed by removing a portion of the via insulation layer VIA. In one embodiment, the pixel electrode PE may include a conductive material. Examples of conductive materials that may be used as the pixel electrode PE may include aluminum, platinum, palladium, silver, magnesium, gold, nickel, neodymium, iridium, chromium, lithium, calcium, molybdenum, titanium, tungsten, copper, indium tin oxide, indium zinc oxide, and the like. These materials may be used alone or in combination with each other.

The pixel defining layer PDL may be disposed on the via insulating layer VIA. An opening exposing at least a portion of the pixel electrode PE may be defined in the pixel defining layer PDL. In one embodiment, the pixel defining layer PDL may include an organic insulating material. Examples of organic insulating materials that may be used as the pixel defining layer PDL may include photoresist, polyacrylic resin, polyimide resin, acrylic resin, and the like. These materials may be used alone or in combination with each other.

The light emitting layer EL may be disposed on the pixel electrode PE. The light emitting layer EL may be disposed on (e.g., on a portion of) the pixel electrode PE exposed by the opening in the pixel defining layer PDL. In one embodiment, the light emitting layer EL may include an organic material and may emit light of a certain color.

The common electrode CE may be disposed on the light emitting layer EL and the pixel defining layer PDL. In one embodiment, the common electrode CE may include a conductive material. Examples of conductive materials that may be used as the common electrode CE may include aluminum, platinum, silver, magnesium, gold, chromium, tungsten, titanium, and the like. These materials may be used alone or in combination with each other.

The pixel electrode PE, the light emitting layer EL, and the common electrode CE may form a light emitting element LD. The light emitting element LD may emit light based on (or according to) a driving current transmitted from the transistor TR.

The encapsulation layer TFE may be disposed on the common electrode CE. For example, the encapsulation layer TFE may have a structure in which inorganic layers and organic layers are alternately stacked. In one embodiment, the encapsulation layer TFE may include an insulating material. The encapsulation layer TFE may prevent foreign materials from penetrating into the light emitting layer EL.

Figure 3:
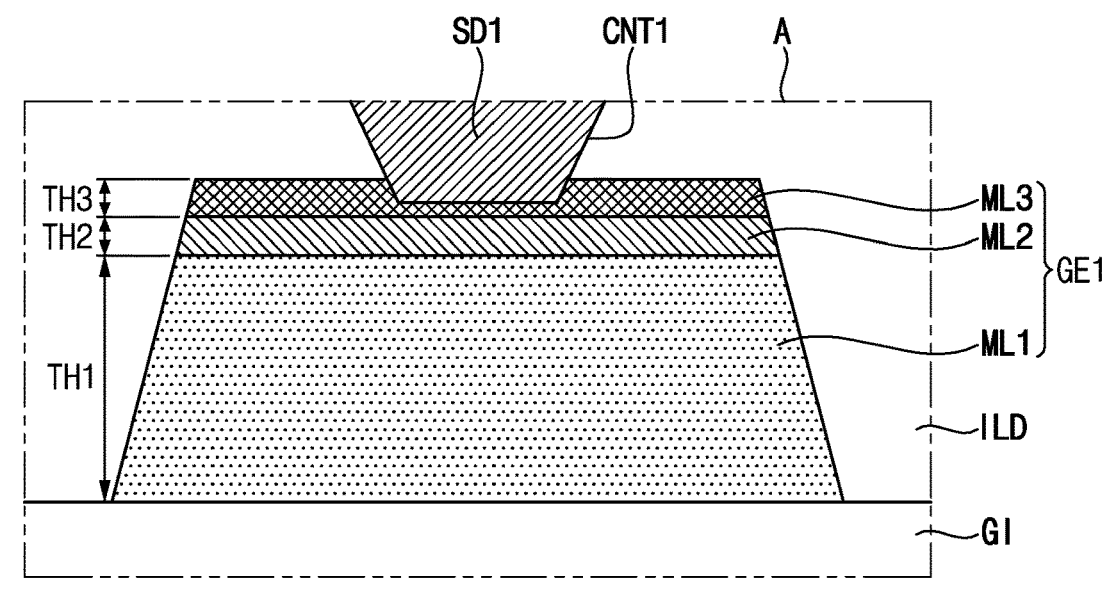
FIG. 3 is an enlarged cross-sectional view of the area A of FIG. 2.
Figure 4:
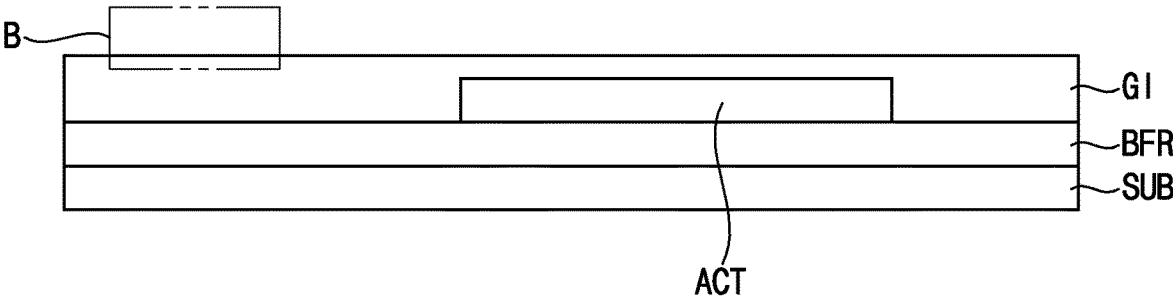
FIGS. 4 to 16 are cross-sectional views illustrating steps of a method of manufacturing the display device shown in FIG. 1.

FIG. 3 is an enlarged cross-sectional view of the area A of FIG. 2. For example, FIG. 3 may be an enlarged cross-sectional view of the first gate electrode GE1.

Referring to FIGS. 2 and 3, the first gate electrode GE1 may include a first metal layer ML1, a second metal layer ML2, and a third metal layer ML3. Although only a cross-sectional structure of the first gate electrode GE1 is shown in FIG. 3, a cross-sectional structure of the second gate electrode GE2 may be substantially the same as that of the first gate electrode GE1.

The first metal layer ML1 may be disposed on the gate insulating layer GI.

In one embodiment, the first metal layer ML1 may include aluminum. In another embodiment, the first metal layer ML1 may include an aluminum alloy. In such an embodiment, a content of material(s) other than aluminum in the aluminum alloy may be about 0.1 at % or less. For example, the aluminum alloy may include a nickel (Ni)-lanthanum (La) alloy of about 0.06 at %. When the content of material(s) other than aluminum in the aluminum alloy exceeds about 0.1 at %, the resistance of the first metal layer ML1 may increase. In addition, etching of the first metal layer ML1 may be difficult.

The second metal layer ML2 may be disposed on the first metal layer ML1. In one embodiment, the second metal layer ML2 may include a transparent conductive oxide (TCO). For example, the second metal layer ML2 may include the transparent conductive oxide including indium, gallium, and zinc. For example, the second metal layer ML2 may include indium gallium zinc oxide (IGZO). In such an embodiment, the second metal layer ML2 may control heat generation of the first gate electrode GE1. For another example, the second metal layer ML2 may include indium zinc oxide (IZO).

The third metal layer ML3 may be disposed on the second metal layer ML2. In one embodiment, the third metal layer ML3 may include a niobium (Nb)-titanium (Ti) alloy. In such an embodiment, a content of titanium forming the niobium-titanium alloy may be about 50 at % or less. When the content of titanium forming the niobium-titanium alloy exceeds about 50 at %, the resistance of the third metal layer ML3 may increase. In addition, during a cleaning process, the third metal layer ML3 may react with a cleaning solution and may be corroded.

In one embodiment, a thickness TH1 of the first metal layer ML1 may be in a range of about 2500 Å to about 3500 Å, a thickness TH2 of the second metal layer ML2 may be in a range of about 200 Å to about 300 Å, and a thickness TH3 of the third metal layer ML3 may be in a range of about 200 Å to about 300 Å. However, the present disclosure is not limited thereto.

The first electrode SD1 may be disposed on the first gate electrode GE1. For example, the first electrode SD1 may contact the first gate electrode GE1 through the first contact hole CNT1 formed by removing at least a portion of the interlayer insulating layer ILD.

In one embodiment, the first contact hole CNT1 may be formed by removing a portion of the third metal layer ML3. Accordingly, the first electrode SD1 may contact the third metal layer ML3 through the first contact hole CNT1. However, the present disclosure is not limited thereto. For example, the first contact hole CNT1 may be formed without removing the third metal layer ML3. Accordingly, the first electrode SD1 may contact an upper surface of the third metal layer ML3 through the first contact hole CNT1. In another embodiment, the first contact hole CNT1 may be formed through the third metal layer ML3. Accordingly, the first electrode SD1 may contact an upper surface of the second metal layer ML2 through the first contact hole CNT1.

FIGS. 4 to 16 are cross-sectional views illustrating steps of a method of manufacturing the display device 10 shown in FIG. 1. For example, FIGS. 5, 6, and 7 may be enlarged cross-sectional views of the area B of FIG. 4, FIGS. 9, 10, and 11 may be enlarged cross-sectional views of the area C of FIG. 8, and FIG. 14 may be an enlarged cross-sectional view of area D of FIG. 13.

Referring to FIGS. 4, 5, 6, and 7, the buffer layer BFR, the active layer ACT, and the gate insulating layer GI may be sequentially formed on the substrate SUB.

Figure 5:
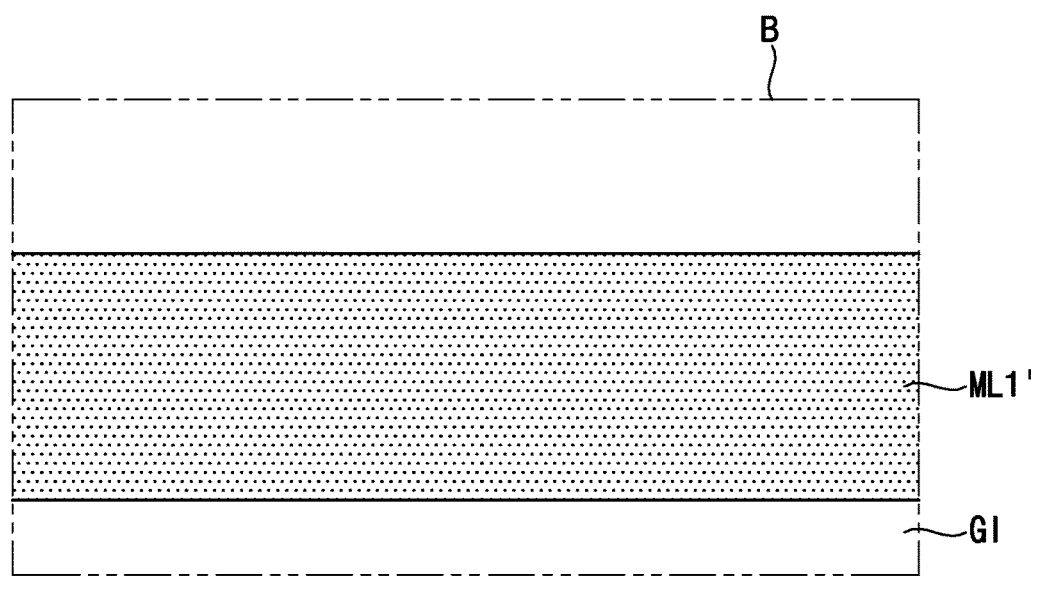

Referring to FIG. 5, a preliminary first metal layer ML1' may be formed on the gate insulating layer GI. In one embodiment, the preliminary first metal layer ML1' may include aluminum. In another embodiment, the preliminary first metal layer ML1' may include an aluminum alloy, and a content of material(s) other than aluminum in the aluminum alloy may be about 0.1 at % or less.

Figure 6:
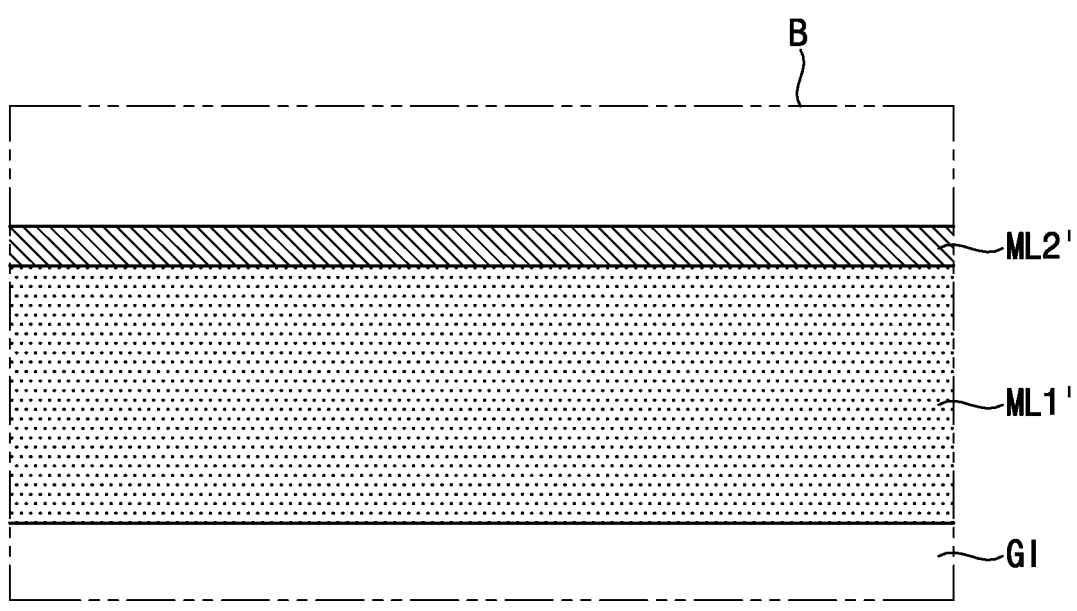

Referring to FIG. 6, a preliminary second metal layer ML2' may be formed on the preliminary first metal layer ML1'. In one embodiment, the preliminary second metal layer ML2' may include a transparent conductive oxide. For example, the preliminary second metal layer ML2' may include indium gallium zinc oxide. In another embodiment, the preliminary second metal layer ML2' may include indium zinc oxide.

Figure 7:
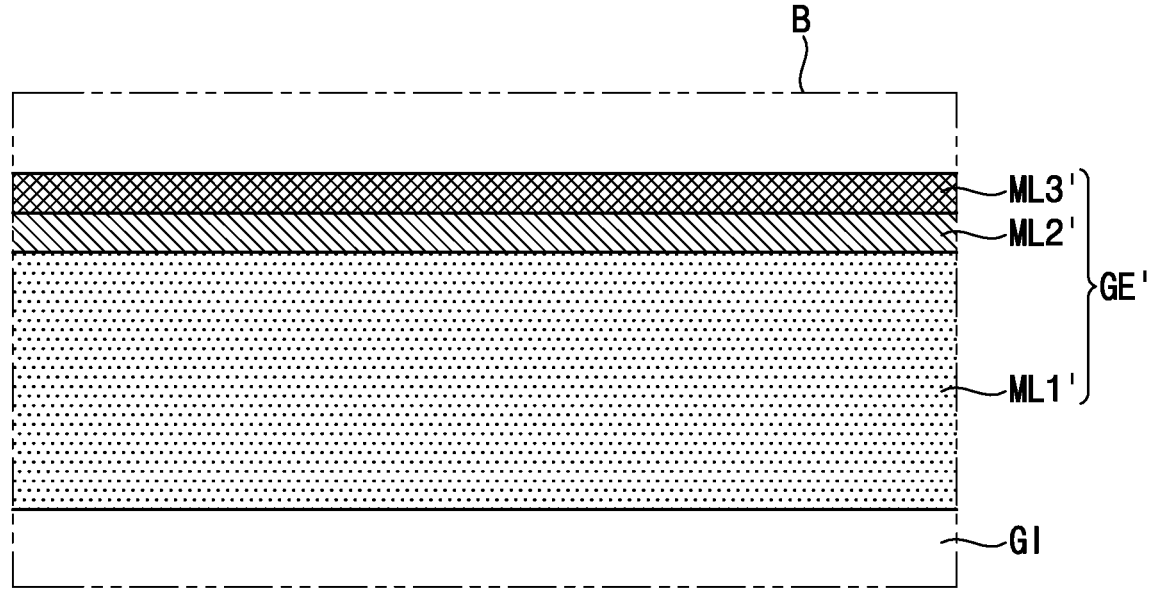

Referring to FIG. 7, a preliminary third metal layer ML3' may be formed on the preliminary second metal layer ML2'. In one embodiment, the preliminary third metal layer ML3' may include a niobium-titanium alloy, and a content of titanium forming the niobium-titanium alloy may be about 50 at % or less.

The preliminary first metal layer ML1', the preliminary second metal layer ML2', and the preliminary third metal layer ML3' may form a preliminary gate electrode GE'.

Figure 8:
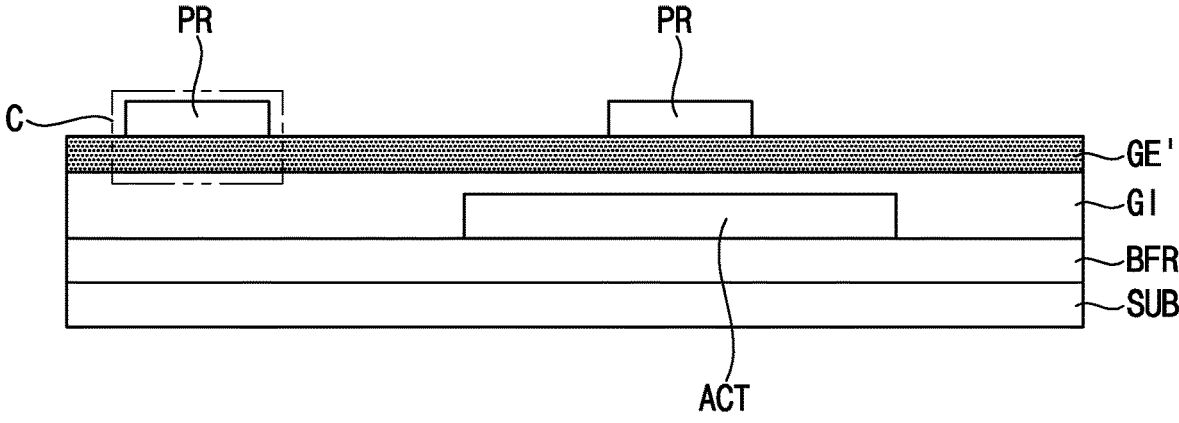
Figure 9:
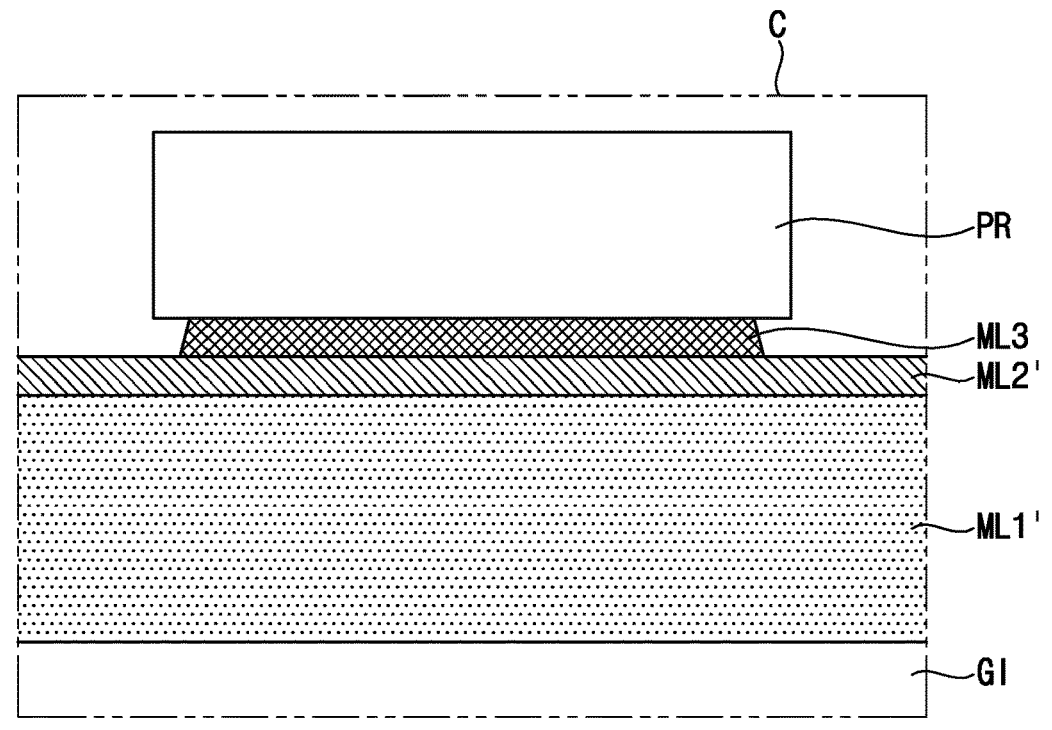
Figure 10:
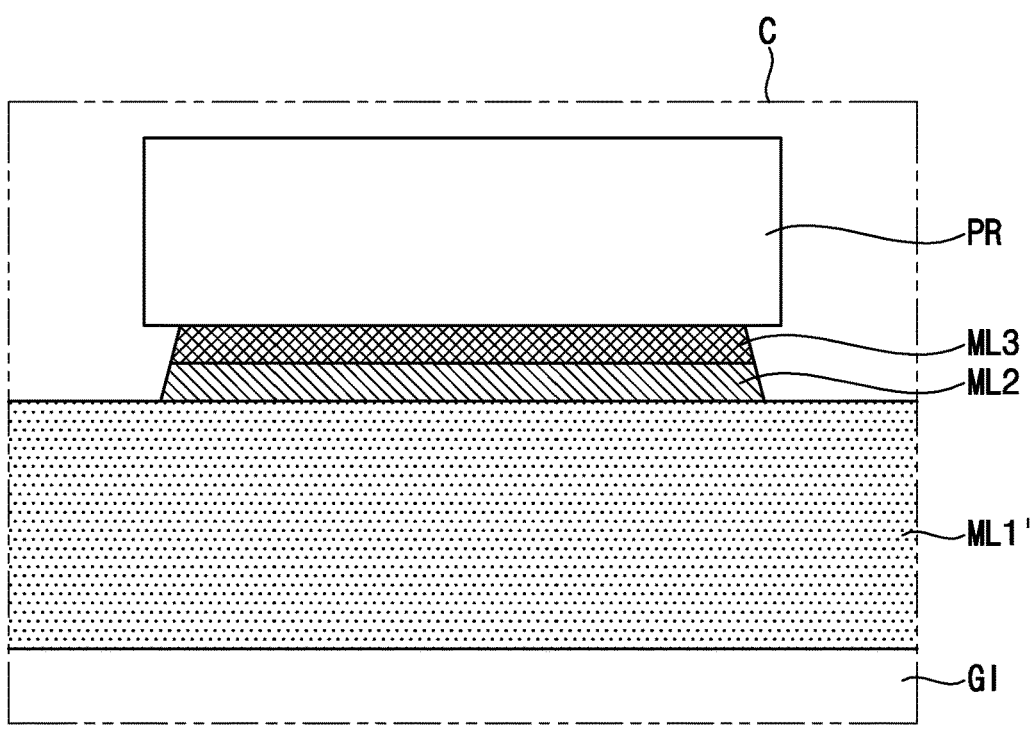
Figure 11:
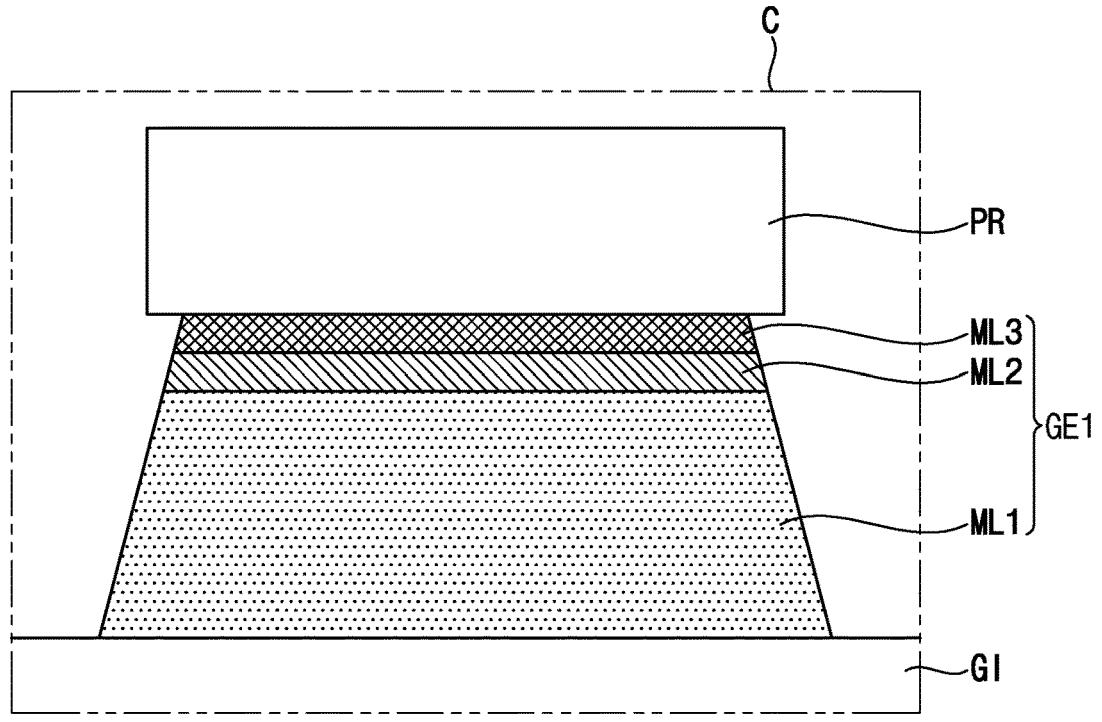

Referring to FIG. 8, a photoresist pattern PR may be formed on the preliminary gate electrode GE'.

The preliminary first metal layer ML1', the preliminary second metal layer ML2', and the preliminary third metal layer ML3' may be patterned using the photoresist pattern PR. For example, referring to FIG. 9, the third metal layer ML3 may be formed by dry etching the preliminary third metal layer ML3'. Then, referring to FIG. 10, the second metal layer ML2 may be formed by wet etching the preliminary second metal layer ML2'. The second metal layer ML2 may be formed to overlap the third metal layer ML3. Then, referring to FIG. 11, the first metal layer ML1 may be formed by dry etching the preliminary first metal layer ML1'. The first metal layer ML1 may be formed to overlap the second metal layer ML2 and the third metal layer ML3. Thus, the first gate electrode GE1 may be formed by patterning the preliminary gate electrode GE' according to the photoresist pattern PR.

Although FIGS. 8, 9, 10, and 11 illustrate only steps of forming the first gate electrode GE1, the second gate electrode GE2 may be formed through substantially the same process as the first gate electrode GE1.

Figure 12:
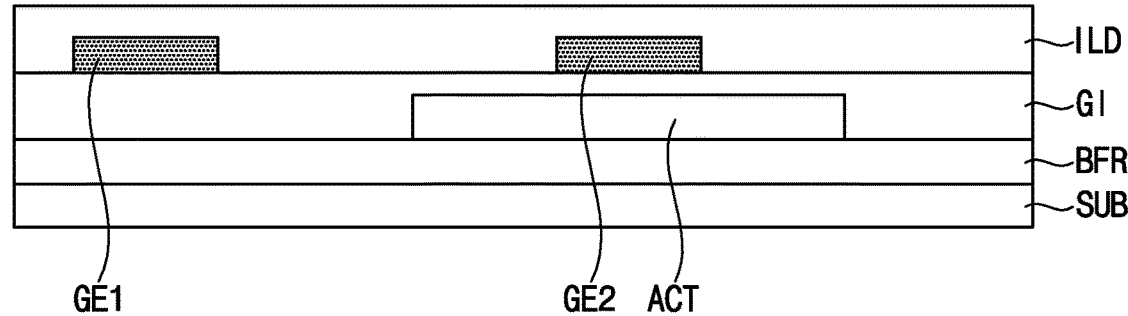

Referring to FIG. 12, the photoresist pattern PR may be removed, and the interlayer insulating layer ILD may be formed on the gate insulating layer GI. The interlayer insulating layer ILD may be formed to cover the first gate electrode GE1 and the second gate electrode GE2.

Figure 13:
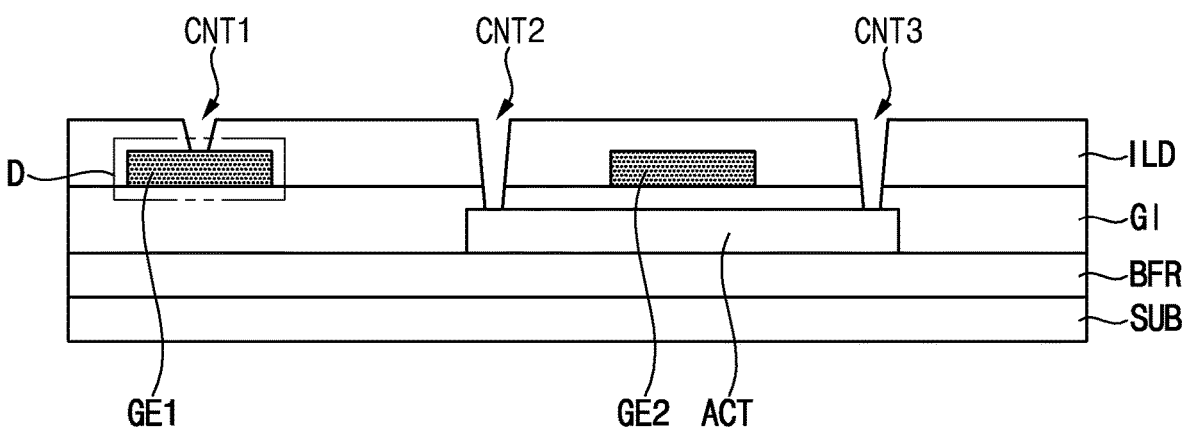
Figure 14:
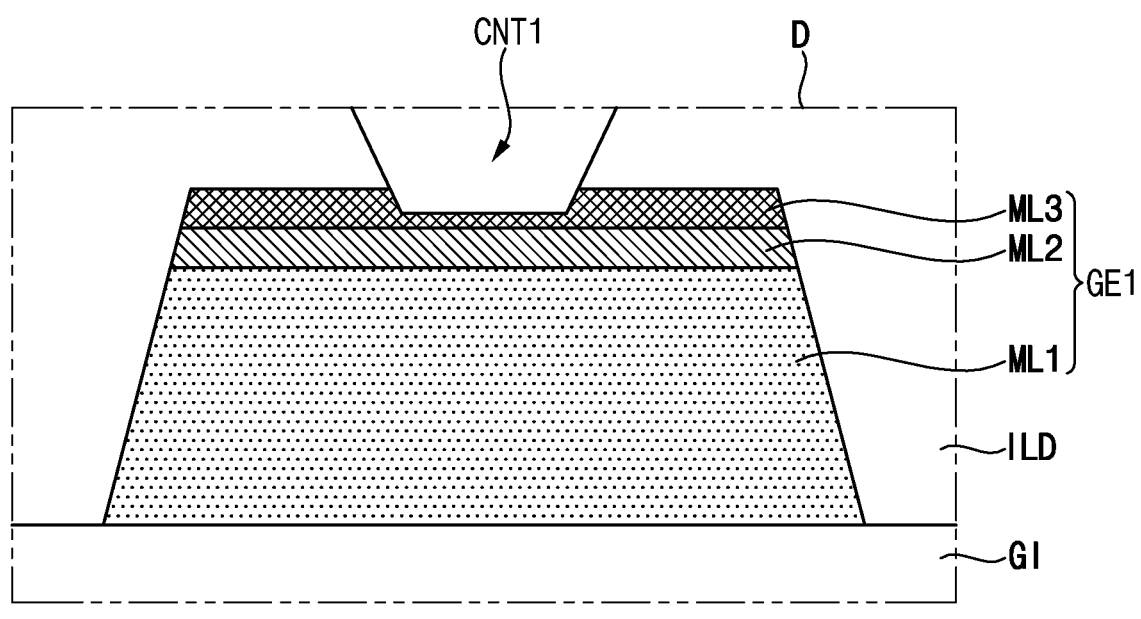

Referring to FIGS. 13 and 14, the first contact hole CNT1 may be formed by removing a portion of the interlayer insulating layer ILD, and the second contact hole CNT2 and the third contact hole CNT3 may be respectively formed by removing portions of the gate insulating layer GI and the interlayer insulating layer ILD.

The first contact hole CNT1, exposing at least a portion of the first gate electrode GE1, may be formed by dry etching the interlayer insulating layer ILD. The second contact hole CNT2 and the third contact hole CNT3, respectively exposing at least a portion of the active layer ACT, may be formed by dry etching the gate insulating layer GI and the interlayer insulating layer ILD.

In one embodiment, referring to FIG. 14, a portion of the third metal layer ML3 may be removed by dry etching the third metal layer ML3 included in the first gate electrode GE1. Accordingly, the first contact hole CNT1 extending into (or removing) a portion of the third metal layer ML3 may be formed. However, the present disclosure is not limited thereto.

For example, the third metal layer ML3 may not be dry etched, and the first contact hole CNT1 exposing a portion of the upper surface of the third metal layer ML3 may be formed. In another embodiment, the first contact hole CNT1 penetrating the third metal layer ML3 may be formed by dry etching the third metal layer ML3. In such an embodiment, the first contact hole CNT1 may expose a portion of the upper surface of the second metal layer ML2. Because the second metal layer ML2 includes the transparent conductive oxide, the second metal layer ML2 may not be dry etched in such an embodiment. For example, the second metal layer ML2 may act as an etch stopper to prevent the first metal layer ML1 from being etched.

Figure 15:
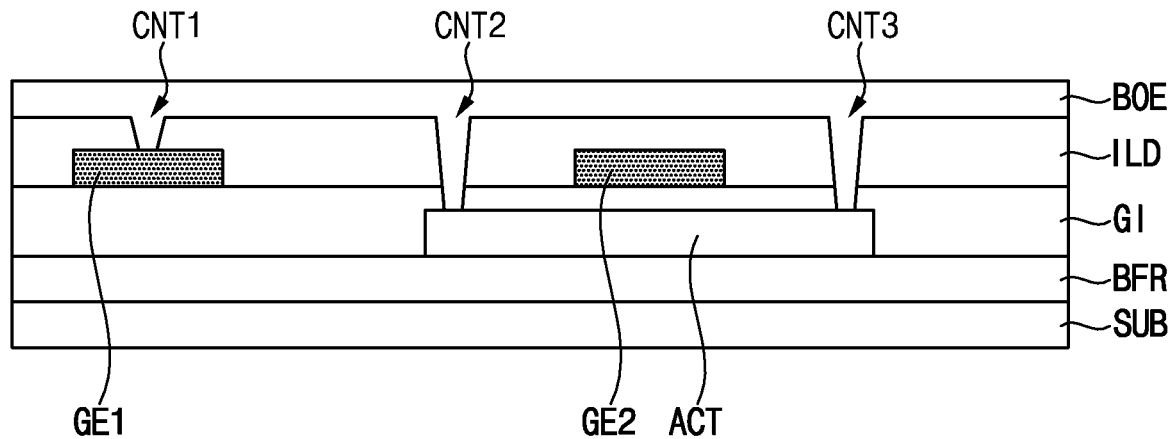

Referring to FIG. 15, the first gate electrode GE1, exposed by the first contact hole CNT1, and the active layer ACT, exposed by the second and third contact holes CNT2 and CNT3, may be cleaned. For example, the first gate electrode GE1 exposed by the first contact hole CNT1 and the active layer ACT exposed by each of the second and third contact holes CNT2 and CNT3 may be concurrently (or simultaneously) cleaned by using a cleaning solution BOE. The cleaning solution BOE may be an aqueous solution in which hydrogen fluoride (HF) is dissolved. For example, the cleaning solution BOE may include about 0.5% hydrogen fluoride. Because the active layer ACT exposed by each of the second and third contact holes CNT2 and CNT3 is cleaned with the cleaning solution BOE, a natural oxide layer formed on the active layer ACT, exposed by each of the second and third contact holes CNT2 and CNT3, may be removed.

In one embodiment, the third metal layer ML3 of the first gate electrode GE1 exposed by the first contact hole CNT1 may not react with the cleaning solution BOE. Because the third metal layer ML3 includes the niobium-titanium alloy that is resistant to the cleaning solution BOE, the third metal layer ML3 may not react with the cleaning solution BOE. In other words, the third metal layer ML3 may prevent the first metal layer ML1, which includes aluminum, from reacting with the cleaning solution BOE and being corroded.

In another embodiment, the second metal layer ML2 of the first gate electrode GE1 exposed by the first contact hole CNT1 may not react with the cleaning solution BOE. Because the second metal layer ML2 includes the transparent conductive oxide (e.g., indium gallium zinc oxide or indium zinc oxide), the second metal layer ML2 may not react with the cleaning solution BOE. In other words, the second metal layer ML2 may prevent the first metal layer ML1 including aluminum from reacting with the cleaning solution BOE and being corroded.

Figure 16:
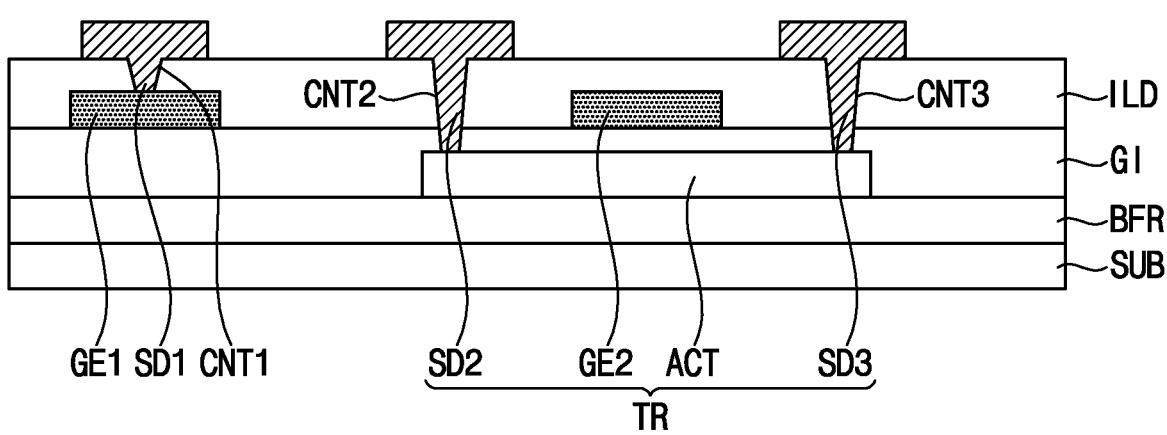

Referring to FIG. 16, the first electrode SD1, the second electrode SD2, and the third electrode SD3 may be formed on the interlayer insulating layer ILD.

The first electrode SD1 may be formed to contact the first gate electrode GE1 through the first contact hole CNT1, the second electrode SD2 may be formed to contact the active layer ACT through the second contact hole CNT2, and the third electrode SD3 may be formed to contact the active layer ACT through the third contact hole CNT3. The active layer ACT, the second gate electrode GE2, the second electrode SD2, and the third electrode SD3 may form the transistor TR.

Referring back to FIG. 2, the via insulating layer VIA, the light emitting element LD, and the encapsulation layer TFE may be sequentially formed on the interlayer insulating layer ILD. Thus, the display device 10 may be formed.

The display device 10, according to an embodiment of the present disclosure, may include the first gate electrode GE1 including the first metal layer ML1, the second metal layer ML2 disposed on the first metal layer ML1, and the third metal layer ML3 disposed on the second metal layer ML2. Because the first metal layer ML1 includes aluminum, resistance of electrodes and wires including the first metal layer ML1 may be reduced. In addition, because the second metal layer ML2 includes the transparent conductive oxide, heat generation of the first gate electrode GE1 may be controlled. In addition, when the first contact hole CNT1 is formed exposing the first gate electrode GE1, the first metal layer ML1 may not be etched. Accordingly, connection defects due to an etched first metal layer ML1 may be prevented and display quality of the display device 10 may be improved. In addition, because the third metal layer ML3 includes the niobium-titanium alloy, aluminum included in the first metal layer ML1 may not be corroded by a reaction between the cleaning solution BOE and the first metal layer ML1 during the cleaning process. Accordingly, because a separate mask for the cleaning process may be omitted, efficiency of a manufacturing process of the display device 10 may be improved.

Figure 17:
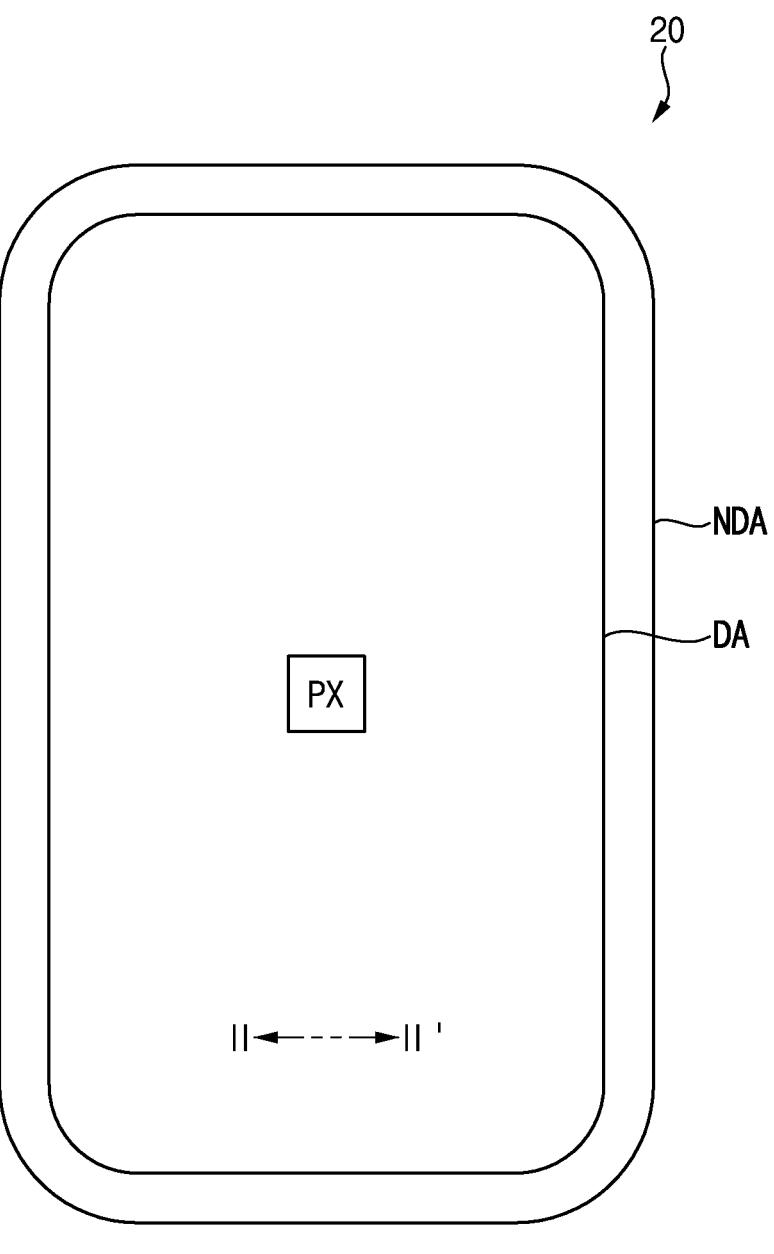
FIG. 17 is a plan view of a display device according to another embodiment of the present disclosure.
Figure 18:
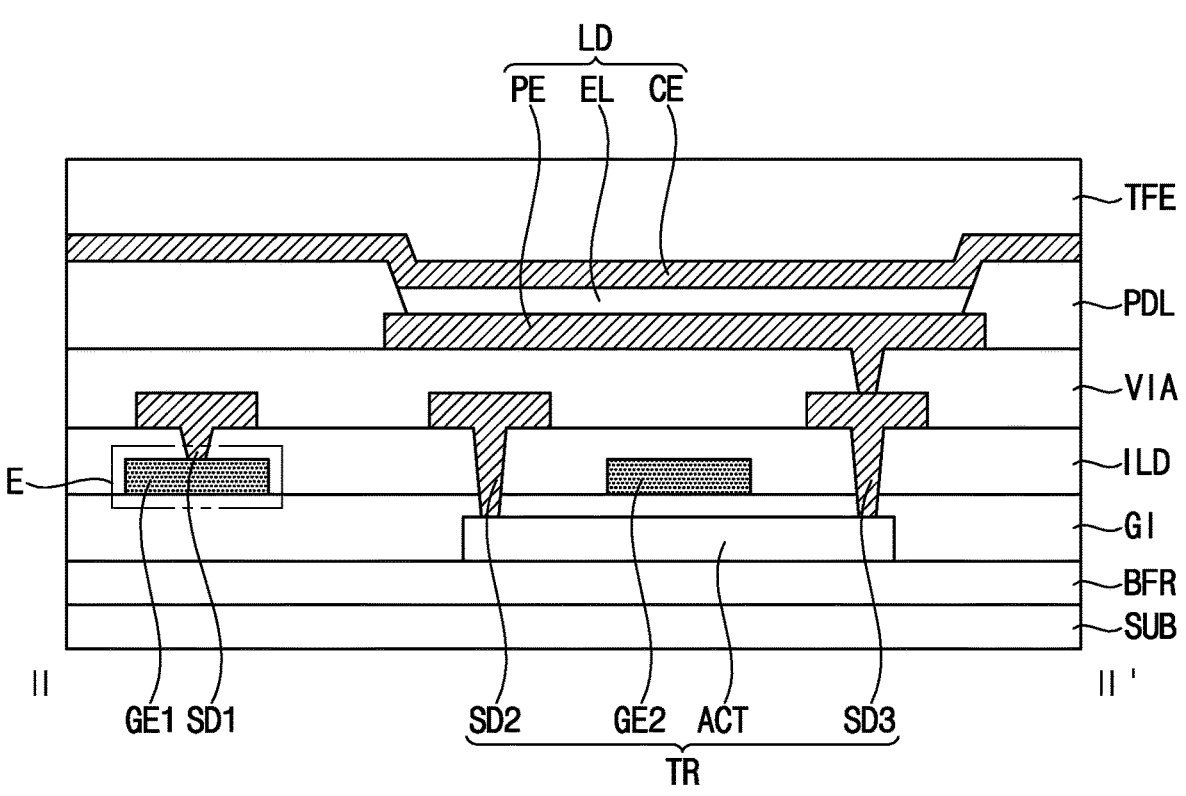
FIG. 18 is a cross-sectional view taken along the line II-II' of FIG. 17.

FIG. 17 is a plan view of a display device according to another embodiment of the present disclosure. FIG. 18 is a cross-sectional view taken along the line II-II' of FIG. 17.

Referring to FIGS. 17 and 18, a display device 20 may include the substrate SUB, the buffer layer BFR, the active layer ACT, the gate insulating layer GI, the first gate electrode GE1, the second gate electrode GE2, the interlayer insulating layer ILD, the first electrode SD1, the second electrode SD2, the third electrode SD3, the via insulating layer VIA, the pixel electrode PE, the pixel defining layer PDL, the light emitting layer EL, the common electrode CE and the encapsulation layer TFE.

Hereinafter, descriptions of layers and components that are the same or substantially similar to those of the display device 10 described above with reference to FIGS. 1, 2, and 3 will be omitted or simplified.

Figure 19:
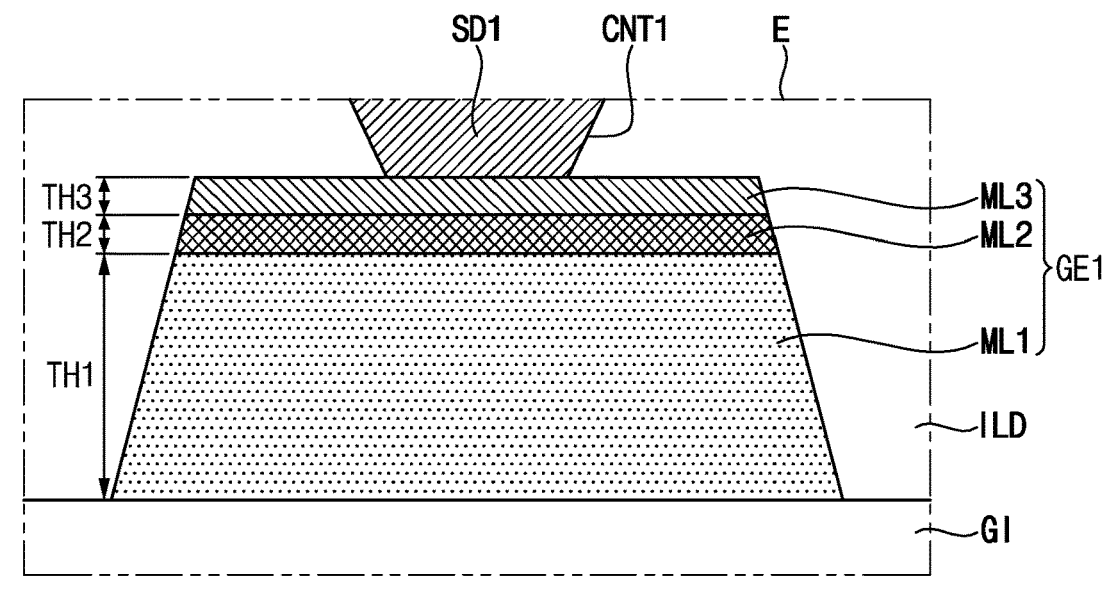
FIG. 19 is an enlarged cross-sectional view of the area E of FIG. 18.

FIG. 19 is an enlarged cross-sectional view of the area E of FIG. 18. For example, FIG. 19 may be an enlarged cross-sectional view of the first gate electrode GE1 shown in FIG. 18.

Referring to FIGS. 18 and 19, the first gate electrode GE1 may include a first metal layer ML1, a second metal layer ML2, and a third metal layer ML3. Although only a cross-sectional structure of the first gate electrode GE1 is shown in FIG. 19, a cross-sectional structure of the second gate electrode GE2 may be substantially the same as that of the first gate electrode GE1.

The first metal layer ML1 may be disposed on the gate insulating layer GI.

In one embodiment, the first metal layer ML1 may include aluminum. In another embodiment, the first metal layer ML1 may include an aluminum alloy. In such an embodiment, a content of material(s) other than aluminum in the aluminum alloy may be about 0.1 at % or less.

The second metal layer ML2 may be disposed on the first metal layer ML1. In such an embodiment, the second metal layer ML2 may include a niobium (Nb)-titanium (Ti) alloy. In such an embodiment, a content of titanium forming the niobium-titanium alloy may be about 50 at % or less.

The third metal layer ML3 may be disposed on the second metal layer ML2. In one embodiment, the third metal layer ML3 may include a transparent conductive oxide including indium, gallium, and zinc. For example, the third metal layer ML3 may include indium gallium zinc oxide. In another embodiment, the third metal layer ML3 may include indium zinc oxide.

In one embodiment, a thickness TH1 of the first metal layer ML1 may be in a range of about 2500 Å to about 3500 Å, a thickness TH2 of the second metal layer ML2 may be in a range of about 200 Å to about 300 Å, and a thickness TH3 of the third metal layer ML3 may be in a range of about 200 Å to about 300 Å. However, the present disclosure is not limited thereto.

The first electrode SD1 may be disposed on the first gate electrode GE1. The first electrode SD1 may contact the first gate electrode GE1 through the first contact hole CNT1 formed by removing at least a portion of the interlayer insulating layer ILD. In an embodiment, the first contact hole CNT1 may be formed without removing the third metal layer ML3 so that the first electrode SD1 contacts the upper surface of the third metal layer ML3 through the first contact hole CNT1.

FIGS. 20 to 26 are cross-sectional views illustrating steps of a method of manufacturing the display device 20 shown in FIG. 17. For example, FIGS. 21 and 22 may be enlarged cross-sectional views of the area F of FIG. 20, and FIG. 24 may be an enlarged cross-sectional view of the area G of FIG. 23.

Hereinafter, descriptions of layers and components that are the same or substantially similar to those of the display device 10 described above with reference to FIGS. 4 to 16 will be omitted or simplified.

Figure 20:
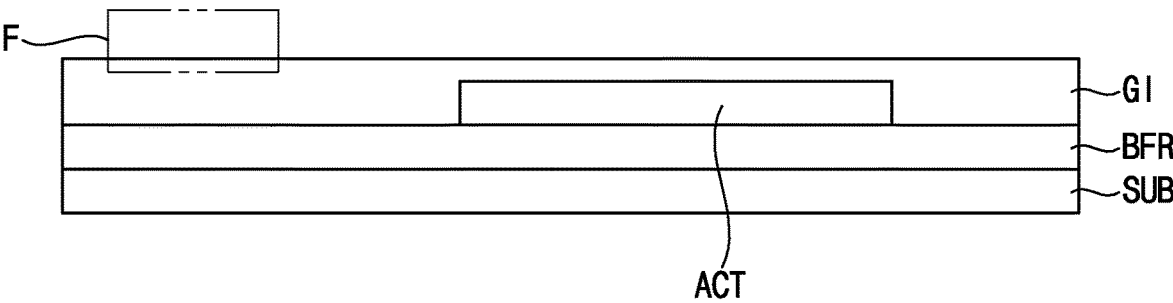
FIGS. 20 to 26 are cross-sectional views illustrating steps of a method of manufacturing the display device shown in FIG. 17.
Figure 21:
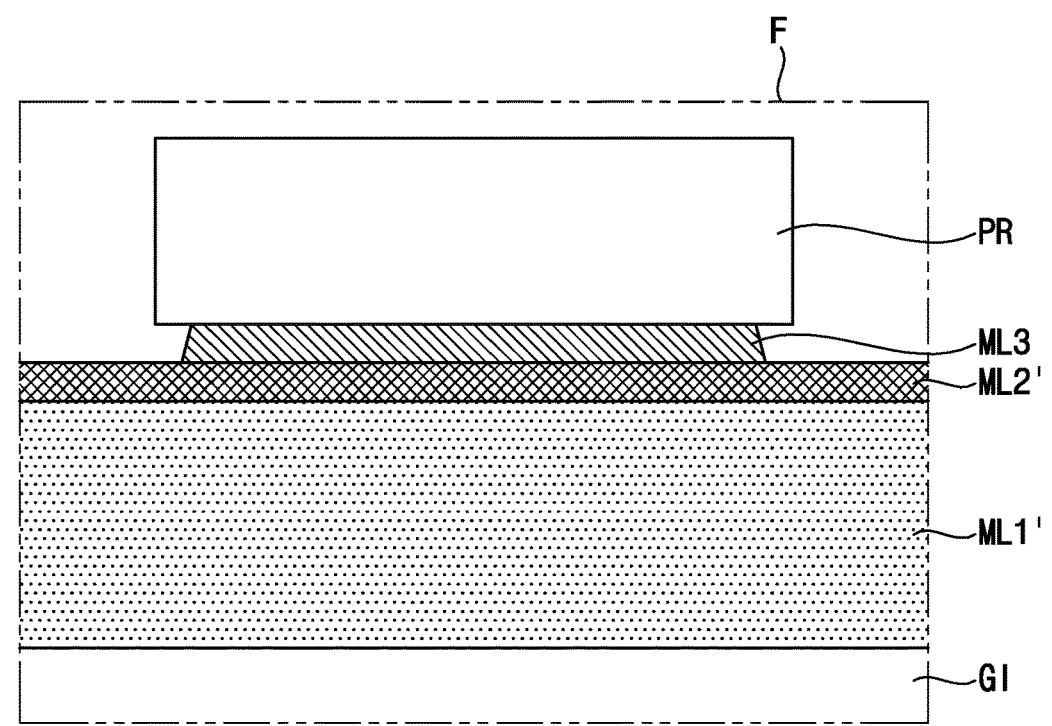
Figure 22:
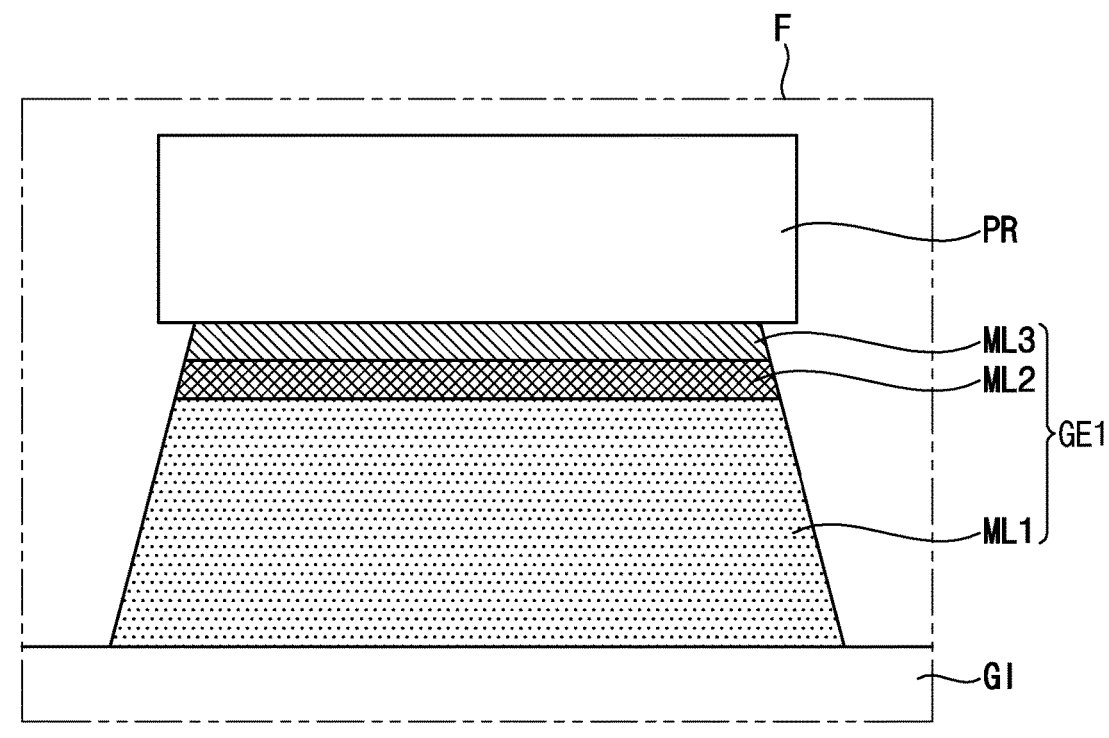

Referring to FIGS. 20, 21, and 22, the buffer layer BFR, the active layer ACT, and the gate insulating layer GI may be sequentially formed on the substrate SUB.

A preliminary first metal layer ML1' may be formed on the gate insulating layer GI. In one embodiment, the preliminary first metal layer ML1' may include aluminum. In another embodiment, the preliminary first metal layer ML1' may include an aluminum alloy, and a content of material(s) other than aluminum in the aluminum alloy may be about 0.1 at % or less.

A preliminary second metal layer ML2' may be formed on the preliminary first metal layer ML1'. In one embodiment, the preliminary second metal layer ML2' may include a niobium-titanium alloy, and a content of titanium forming the niobium-titanium alloy may be about 50 at % or less.

A preliminary third metal layer may be formed on the preliminary second metal layer ML2'. In one embodiment, the preliminary third metal layer may include a transparent conductive oxide. For example, the preliminary third metal layer may include indium gallium zinc oxide. In another embodiment, the preliminary third metal layer may include indium zinc oxide.

The preliminary first metal layer ML1', the preliminary second metal layer ML2', and the preliminary third metal layer may form a preliminary gate electrode.

A photoresist pattern PR may be formed on the preliminary third metal layer. The preliminary first metal layer ML1', the preliminary second metal layer ML2', and the preliminary third metal layer may be patterned using the photoresist pattern PR. Referring to FIG. 21, the third metal layer ML3 may be formed by wet etching the preliminary third metal layer. Then, referring to FIG. 22, the second metal layer ML2 and the first metal layer ML1 may be respectively formed by concurrently (or simultaneously) dry etching the preliminary second metal layer ML2' and the preliminary first metal layer ML1'. The second metal layer ML2 may be formed to overlap the third metal layer ML3, and the first metal layer ML1 may be formed to overlap the second metal layer ML2 and the third metal layer ML3. Thus, the first gate electrode GE1 may be formed by patterning the preliminary gate electrode by using (or according to) the photoresist pattern PR.

In one embodiment, after the second metal layer ML2 and the first metal layer ML1 are respectively formed, the third metal layer ML3 may be additionally wet etched, but this step may be omitted. In other words, the process of additionally wet etching the third metal layer ML3 may be excluded.

Although FIGS. 20, 21, and 22 illustrate only a method of forming the first gate electrode GE1, the second gate electrode GE2 may be formed through substantially the same process as the first gate electrode GE1.

Figure 23:
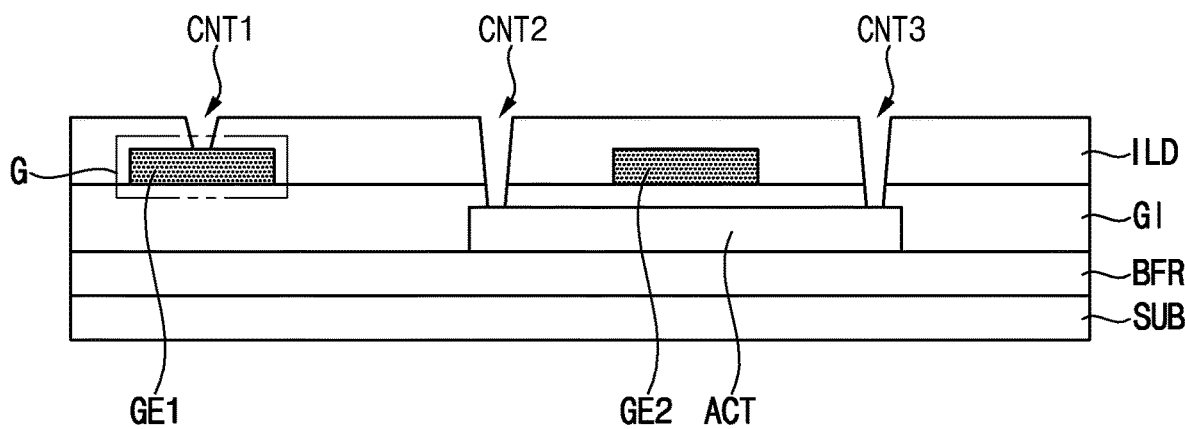
Figure 24:
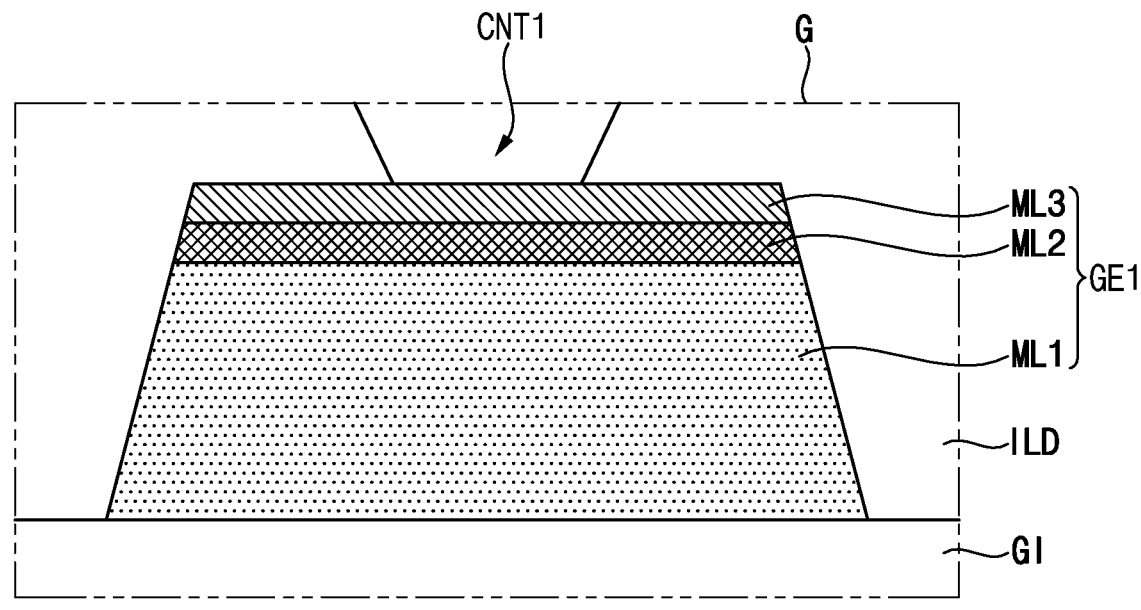

Referring to FIGS. 22, 23, and 24, the photoresist pattern PR may be removed, and the interlayer insulating layer ILD may be formed on the gate insulating layer GI. The first contact hole CNT1 may be formed by removing a portion of the interlayer insulating layer ILD, and the second contact hole CNT2 and the third contact hole CNT3 may be respectively formed by removing portions of the gate insulating layer GI and the interlayer insulating layer ILD.

The first contact hole CNT1, exposing at least a portion of the first gate electrode GE1, may be formed by dry etching the interlayer insulating layer ILD. The second contact hole CNT2 and the third contact hole CNT3, respectively exposing at least a portion of the active layer ACT, may be formed by dry etching the gate insulating layer GI and the interlayer insulating layer ILD.

In one embodiment, because the third metal layer ML3 included in the first gate electrode GE1 includes the transparent conductive oxide, the third metal layer ML3 may not be dry etched. Because the third metal layer ML3 is not dry etched, the first contact hole CNT1 may expose a portion of the upper surface of the third metal layer ML3. In other words, the third metal layer ML3 may act as an etch stopper to protect the first metal layer ML1 and the second metal layer ML2 from being etched.

Figure 25:
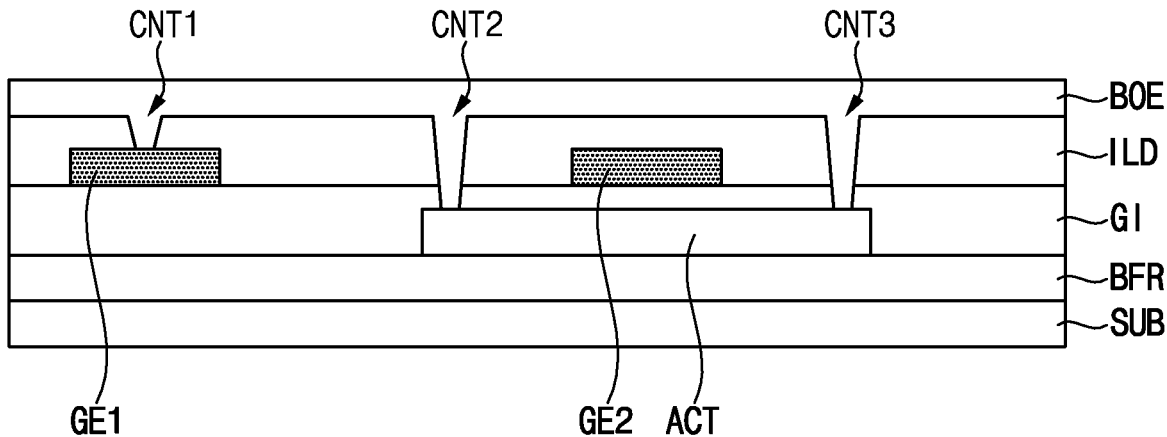

Referring to FIG. 25, the first gate electrode GE1, exposed by the first contact hole CNT1, and the active layer ACT, exposed by the second and third contact holes CNT2 and CNT3, may be concurrently (or simultaneously) cleaned by using the cleaning solution BOE.

In one embodiment, the third metal layer ML3 and the second metal layer ML2 of the first gate electrode GE1 may not react with the cleaning solution BOE. Because the third metal layer ML3 includes the transparent conductive oxide and the second metal layer ML2 includes the niobium-titanium alloy, the third metal layer ML3 and the second metal layer ML2 may not react with the cleaning solution BOE. In other words, the second and third metal layers ML2 and ML3 may prevent the first metal layer ML1, which includes aluminum, from reacting with the cleaning solution BOE and being corroded.

Figure 26:
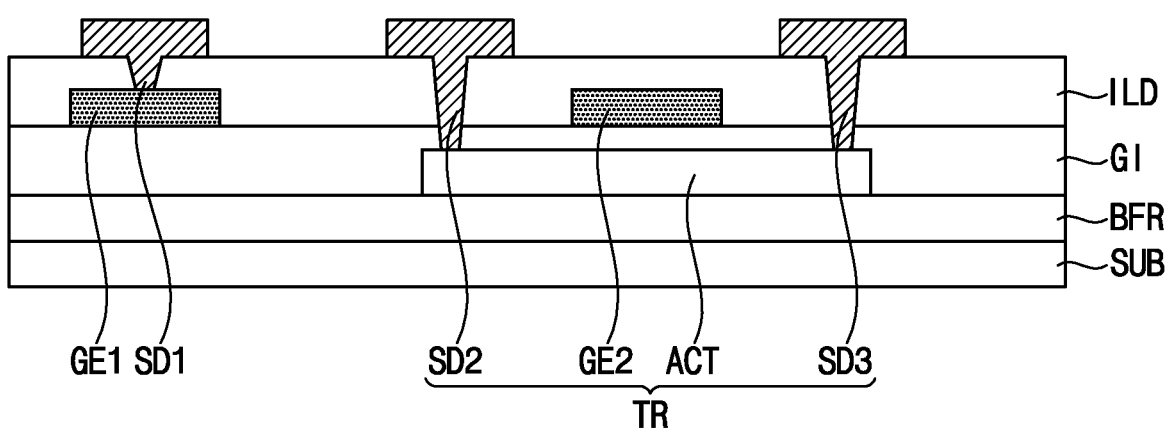

Referring to FIG. 26, the first electrode SD1, the second electrode SD2, and the third electrode SD3 may be formed on the interlayer insulating layer ILD.

Referring back to FIG. 18, the via insulating layer VIA, the light emitting element LD, and the encapsulation layer TFE may be sequentially formed on the interlayer insulating layer ILD. Thus, the display device 20 may be formed.

The display device 20, according to an embodiment of the present disclosure, may include the first metal layer ML1, the second metal layer ML2 disposed on the first metal layer ML1 and the third metal layer ML3 disposed on the second metal layer ML2. Because the second metal layer ML2 includes the niobium-titanium alloy, the aluminum included in the first metal layer ML1 may not be corroded due to a reaction between the cleaning solution BOE and the first metal layer ML1 in the cleaning process. Accordingly, efficiency of a manufacturing process of the display device 20 may be improved. In addition, because the third metal layer ML3 includes the transparent conductive oxide, the third metal layer ML3 may not be etched when the first contact hole CNT1, exposing the first gate electrode GE1, is formed. Accordingly, connection failure due to an etched first metal layer ML1 may be prevented, and display quality of the display device 20 may be improved.

Aspects and features of the present disclosure can be applied to various types of display devices. For example, the present disclosure is applicable to various display devices, such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without departing from the aspects and features of the present disclosure. Accordingly, all such modifications are intended to be included within the scope of the present disclosure as defined in the claims and their equivalents. Therefore, it is to be understood that the foregoing is illustrative of various embodiments, that the present disclosure is not to be construed as limited to the specific embodiments disclosed herein, and that modifications to the disclosed embodiments, as well as other embodiments, are intended to be included within the scope of the appended claims and their equivalents.

What is claimed is:

1. A display device comprising:
   a substrate;
   an active layer on the substrate; and
   a gate electrode on the active layer, the gate electrode comprising a first metal layer, a second metal layer on the first metal layer, and a third metal layer on the second metal layer,
   wherein the first metal layer comprises aluminum, the second metal layer comprises transparent conductive oxide, and the third metal layer comprises a niobium-titanium alloy.

2. The display device of claim 1, wherein a content of titanium in the niobium-titanium alloy is 50 at % or less.

3. The display device of claim 1, wherein the first metal layer comprises an aluminum alloy.

4. The display device of claim 3, wherein a content of materials other than aluminum in the aluminum alloy is 0.1 at % or less.

5. The display device of claim 1, wherein the second metal layer comprises indium gallium zinc oxide.

6. The display device of claim 1, wherein the second metal layer comprises indium zinc oxide.

7. The display device of claim 1, wherein the first metal layer has a thickness in a range of 2500 Å to 3500 Å.

8. The display device of claim 1, wherein each of the second metal layer and the third metal layer has a thickness in a range of 200 Å to 300 Å.

9. The display device of claim 1, wherein the active layer comprises polycrystalline silicon.

10. A display device comprising:
    a substrate;
    an active layer on the substrate, the active layer comprising polycrystalline silicon; and
    a gate electrode on the active layer, the gate electrode comprising a first metal layer, a second metal layer on the first metal layer, and a third metal layer on the second metal layer,
    wherein the first metal layer comprises aluminum, the second metal layer comprises a niobium-titanium alloy, and the third metal layer comprises a transparent conductive oxide.

11. The display device of claim 10, wherein a content of titanium in the niobium-titanium alloy is 50 at % or less.

12. The display device of claim 10, wherein the first metal layer comprises an aluminum alloy.

13. The display device of claim 12, wherein a content of materials other than aluminum in the aluminum alloy is 0.1 at % or less.

14. The display device of claim 10, wherein the third metal layer comprises indium gallium zinc oxide.

15. The display device of claim 10, wherein the third metal layer comprises indium zinc oxide.

16. The display device of claim 10, wherein the first metal layer has a thickness in a range of 2500 Å to 3500 Å, and wherein each of the second metal layer and the third metal layer has a thickness in a range of 200 Å to 300 Å.

17. A method of manufacturing a display device, the method comprising:

forming an active layer on a substrate;

forming a preliminary first metal layer on the active layer, the preliminary first metal layer comprising aluminum;

forming a preliminary second metal layer on the preliminary first metal layer, the preliminary second metal layer comprising a transparent conductive oxide;

forming a preliminary third metal layer on the preliminary second metal layer, the preliminary third metal layer comprising a niobium-titanium alloy; and forming a gate electrode by patterning the preliminary first metal layer, the preliminary second metal layer, and the preliminary third metal layer.

18. The method of claim 17, further comprising:

forming an insulating layer on the gate electrode;

forming contact holes in the insulating layer to respectively expose at least a portion of the active layer and the gate electrode; and concurrently cleaning the portion of the active layer and the gate electrode exposed by the contact holes.

19. The method of claim 17, wherein the forming the gate electrode comprises:

forming a third metal layer by dry etching the preliminary third metal layer;

forming a second metal layer overlapping the third metal layer by wet etching the preliminary second metal layer; and forming a first metal layer overlapping the second metal layer by dry etching the preliminary first metal layer.

20. The method of claim 17, wherein a content of titanium in the niobium-titanium alloy is 50 at % or less.

* * * * *